(12) United States Patent
Shin et al.

(10) Patent No.: US 6,405,431 B1
(45) Date of Patent: *Jun. 18, 2002

(54) METHOD FOR MANUFACTURING BUILD-UP MULTI-LAYER PRINTED CIRCUIT BOARD BY USING YAG LASER

(75) Inventors: Dong Shin; Keon Yang Park; Young Hwan Shin; Byung Kook Sun; Jae Heun Joung, all of Taejeon-si (KR)

(73) Assignee: Samsung Electro-Mechanics Co., Ltd., Kyongki-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/467,780

(22) Filed: Dec. 20, 1999

Related U.S. Application Data (63) Continuation-in-part of application No. 08/882,788, filed on Jun. 26, 1997, now abandoned.

(30) Foreign Application Priority Data

Jun. 27, 1996 (KR) .............................................. 96-24640

(51) Int. Cl.[7] .................................................. H01K 3/10
(52) U.S. Cl. .............................. 29/852; 29/830; 29/846; 427/96; 427/97
(58) Field of Search ........................ 29/830, 846, 852; 427/96, 97, 98

(56) References Cited

U.S. PATENT DOCUMENTS

| | | | |
|---|---|---|---|
| 4,121,007 A | | 10/1978 | Kobayashi et al. |
| 4,258,468 A | * | 3/1981 | Balde |
| 4,348,253 A | | 9/1982 | Subbarar et al. |
| 4,617,730 A | | 10/1986 | Geldermans et al. |
| 5,263,243 A | * | 11/1993 | Taneda et al. |
| 5,393,708 A | | 2/1995 | Hsis et al. |
| 5,425,816 A | | 6/1995 | Cavicchi et al. |
| 5,544,773 A | | 8/1996 | Haruta et l. |
| 5,578,696 A | | 11/1996 | Mochizuki et al. |
| 5,783,482 A | | 7/1998 | Lee et al. |
| 5,817,571 A | | 10/1998 | Yu et al. |
| 5,826,330 A | * | 10/1998 | Isoda et al. |
| 5,837,618 A | | 11/1998 | Avanzino et al. |
| 5,872,064 A | | 2/1999 | Huff et al. |
| 5,880,018 A | | 3/1999 | Boeck et al. |
| 5,972,482 A | * | 10/1999 | Hatakeyama et al. |
| 6,119,335 A | * | 9/2000 | Park et al. |

FOREIGN PATENT DOCUMENTS

| | | |
|---|---|---|
| JP | 4-111497 | 4/1992 |
| JP | 6-104568 | 4/1994 |

* cited by examiner

*Primary Examiner*—Carl J. Arbes
(74) *Attorney, Agent, or Firm*—Lowe Hauptman; Gilman & Berner, LLP (57) ABSTRACT

A method for manufacturing a build-up multi-layer printed circuit board is disclosed in which a YAG laser is used upon the formation of a via hole in the multi-layer printed circuit board, such that it can have the following advantages: the manufacturing process would become simple; the component packaging density and freedom for the design of the board would be improved; and a high speed of signal process would be ensured. The method for manufacturing a build-up multi-layer printed circuit board includes the steps of: forming a first printed circuit pattern on a copper clad laminate (CCL) by applying a general photo-etching process, the CCL having a copper foil on the one face thereof; stacking a resin-coated (on one face) copper foil (RCC) on the CCL with the first printed circuit pattern formed thereon, and heating and pressing this structure; irradiating a YAG laser to the board with said RCC stacked so as to form a via hole at a predetermined position by removing said RCC; carrying out an electroless and electro copper plating on the board with the via hole formed therein to form a plated layer; and forming a second printed circuit pattern on said plated layer to electrically connect the layers on which the first and second printed circuit patterns are formed.

22 Claims, 9 Drawing Sheets

METHOD FOR MANUFACTURING BUILD-UP MULTI-LAYER PRINTED CIRCUIT BOARD BY USING YAG LASER

The present application is a continuation-in-part of U.S. application Ser. No. 08/882,788 filed Jun. 26, 1997, entitled Method for Manufacturing Build-up Multi-layer Printed Circuit Board by Using Yag Laser, now abandoned.

BACKGROUND OF THE INVENTION

1. Field of the Invention

The present invention relates to a method for manufacturing a multi-layer printed circuit board for use in computers, VTR, portable telephones and the like. More particularly, the present invention relates to a method for manufacturing a build-up multi-layer printed circuit board in which an yttrium aluminum garnet (hereinafter, referred to as "YAG") laser is used upon the formation of a via hole in the multi-layer printed circuit board, such that it can have the following advantages: the manufacturing process would become simple; the component packaging density and freedom for the design of the board would be improved; and a high speed of signal process would be ensured.

2. Description of the Prior Art

In the midst of the progress of the electronic components and the component installation technique, the printed circuit board was devised. Since that time, studies have been briskly carried out to make the printed circuit board highly dense. Particularly, the method for manufacturing the multi-layer printed circuit board by applying the build-up method is widely used. This method is different, from the general conventional method in which circuit layers having BVH (blind via holes) are formed, and this method is as follows. That is insulating layers and circuit conductive layers are alternately stacked to form a multi-layer printed circuit board. The manufacture of the printed circuit board based on the build-up method not only is simple, but also the formation of the via hole for serving as the connections between the different layers is easy. Further, in forming the via hole, extremely small diameters are possible, and the thickness of the circuit conductors is very thin, with the result that tiny circuits can be easily formed.

This build-up MLB(multi-layer board) is classified into two kinds in accordance with the method of forming the via hole. One is a method resorting to a chemical etching, and the other is a method using a laser. Recently, the method using a laser is widely used rather than the method resorting to the chemical etching. Further, in manufacturing the build-up MLB, generally the excimer laser is used.

FIG. 1 is illustrates the general process for manufacturing the build-up MLB by using the excimer laser.

Figure 1A:
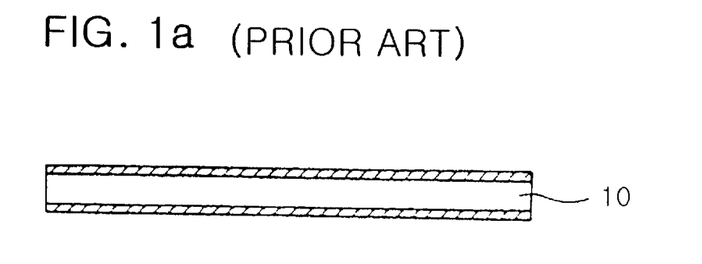
FIG. 1 is a sectional view showing the manufacturing process for a conventional buildup multi-layer printed circuit board.
Figure 1B:
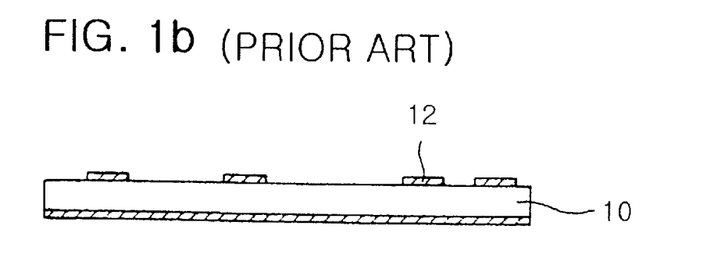

As shown in FIGS. 1a and 1b, first an inner pattern 12 is formed by applying the general photo-etching process on a copper clad laminate(to be called "CCL" below) 10 having insulating layers(in th form of copper oxide) on th both faces thereof.

Figure 1C:
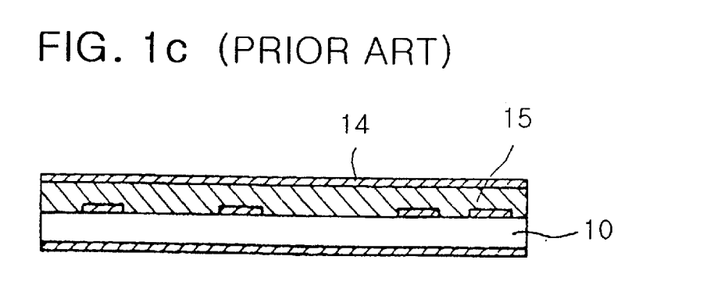

The CCL 10 with the inner pattern 12 formed thereon is pre-stacked on a copper foil 14 with an organic film 15 coated thereon. The pre-stacking is carried out by subjecting them to heating and pressing as shown in FIG. 1c. The organic film-coated copper foil 14 is the one on which an organic film 15 containing no inorganic fiber reinforcing agent such as polymide film is coated. However, in the case of the excimer laser, the processing of the copper is difficult, and therefore, in the pre-stacked board, the copper foil on the organic film-coated foil 14 has to be removed by etching before the hole is formed by means of the excimer laser. Or only the organic film 15 without the copper foil 14 may be used, but in this case, the pressing for the pre-stacking becomes difficult.

Figure 1D:
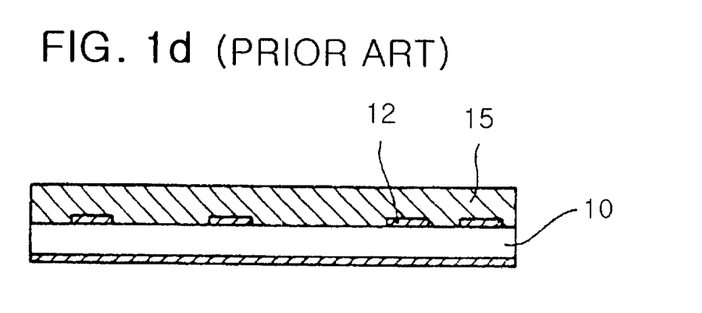

FIG. 1d illustrates a state in which the copper foil of the organic film-coated copper foil 14 has been removed.

Figure 1E:
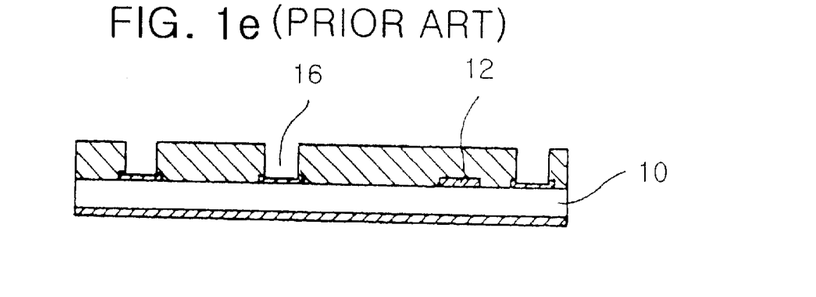

Thereafter, as shown in FIG. 1e, the excimer laser beams are irradiated to the board to form a via hole 16. Under this condition, in the case of the build-up MLB, the via hole can be formed to a diameter of 0.05~0.2 mm.

Figure 1F:
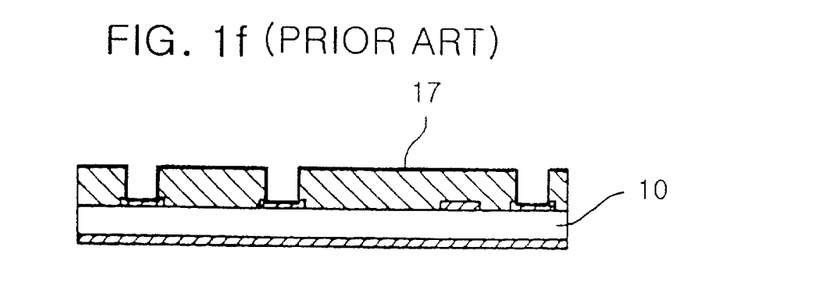
Figure 1G:
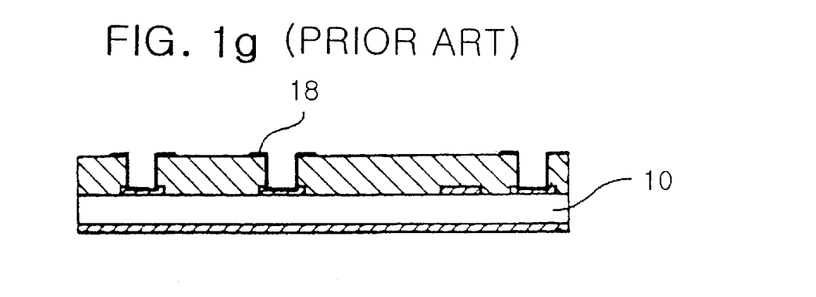

Then as shown in FIG. 1f, the via hole 16 is electroplated by applying an electroless(chemical) copper plating to form an electroplated layer 17, so that the inner-layer contacts of the board can be efficiently realized. Then an electro plating is carried out to form a pattern 18 as shown in FIG. 1g.

If the process steps of FIGS. 1c to 1g are repeated, the circuited layers can be stacked as much as desired.

Figure 1H:
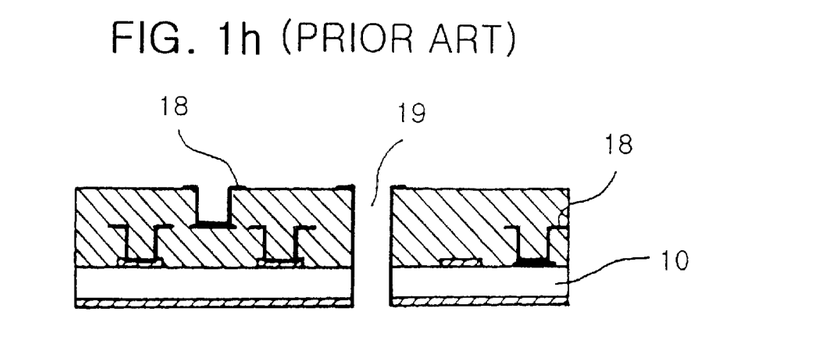

Then finally, a through hole 19 is foamed by mechanical drilling or by using laser beams, thereby obtaining a build-up MLB as shown in FIG. 1h.

The above described manufacturing process has to be carried out on the both faces of the substrate, but in the above, the descriptions were made only for one face for the sake of the describing simplicity.

In the above described conventional method, the via hole is formed by means of the excimer laser. In this case, the organic film-coated copper foil is completely removed by etching, and then, a Cu electroplating is carried out, this being a troublesome task. Particularly, during the use of the excimer laser, in order to prevent the scattering of the optical beams, an image hole mask has to be put on the organic film coated copper foil.

Further, in the case where a material RF-4 is used as substitution for the organic film, the use of the excimer laser becomes impossible. Therefore, the selection of the material for the insulating layer is limited, and the freedom for the drilling depth is lowered, with the result that the density is lowered, Besides, the excimer laser uses toxic gases such as Xe, Cl, XrF, and therefore, a perfect sealing is required. Therefore, the manufacturing factory may cause an environmental pollution.

An another example of methods for processing a via hole in a chemical etching manner is disclosed in U.S. Pat. No, 5,544,773.

In this conventional method, as shown in FIG. 1, a printed circuit pattern is formed on a copper clad laminate (CCL) having copper foils on the both faces thereof, and a resin coated copper foil (to be called "RCC" below) on the one face thereof is stacked on the CCL with the printed circuit pattern to form a pre-stacked board. Next, so as to form the via hole at a predetermined position on the pre-stacked board, first the copper foil on the RCC is primarily removed by using the chemical etching, and the remaining resin is melt by means of an alkali water solution. As mentioned, however, the conventional method should have a double process, which results in some problems in that the hole process is made in a complicated manner and thereby, the productivity would be decreased. Moreover, the hole process of a diameter of 100 μm or less is not possible due to the resolution limit of an etch resist, such that a high integrated component packaging density would not be obtained. In addition, on the printed circuit board with one to three or more printed circuit layers formed thereon, the one to three or more printed circuit layers are not directly connected, such that the freedom for the design of the board would be lowered. On the other hand, in the conventional method the remaining resin within the bottom of the hole after completion of the hole process is removed by using a separate desmear process to ensure the reliability of electroplating within the via hole. At this time, in case of using $KMnO_4$, the resins on the left and right portions within the interior of the via hole would be undesirably damaged.

As another example, there is the build-up MLB manufacturing technique of Japanese Patent Laid-open Hei-4-111497.

Figure 2A:
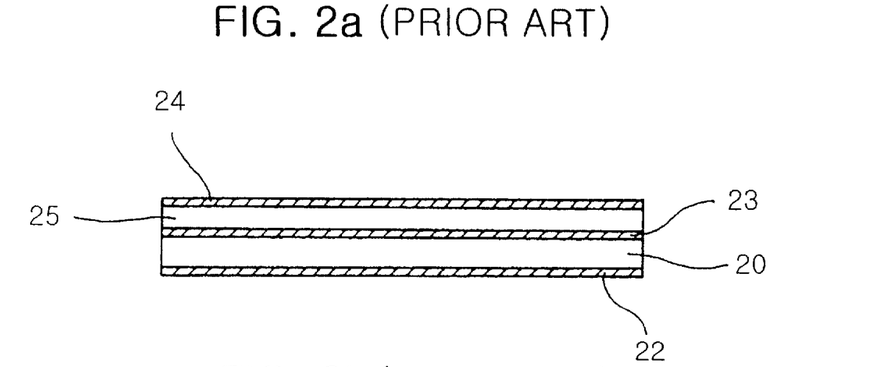
FIG. 2 is a sectional view showing the manufacturing process for another conventional build-up multi-layer printed circuit board.
Figure 2B:
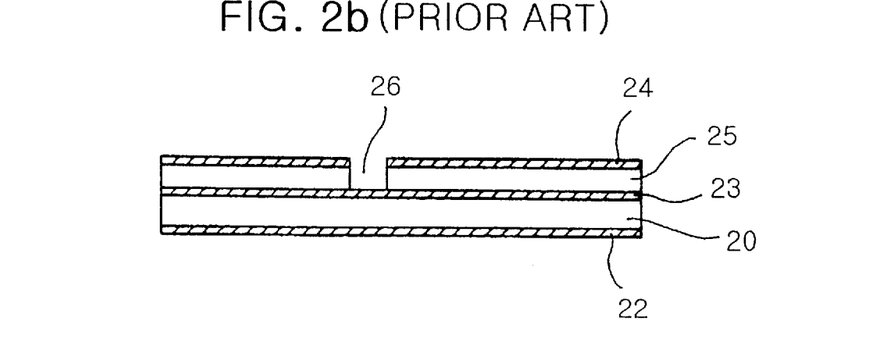
Figure 3A:
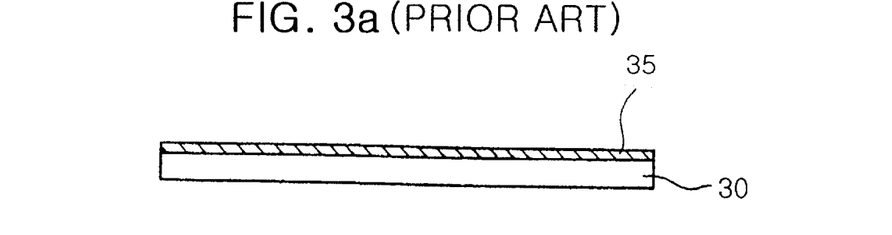
FIG. 3 is a sectional view showing the manufacturing process for still another conventional build-up multi-layer printed circuit board.
Figure 3B:
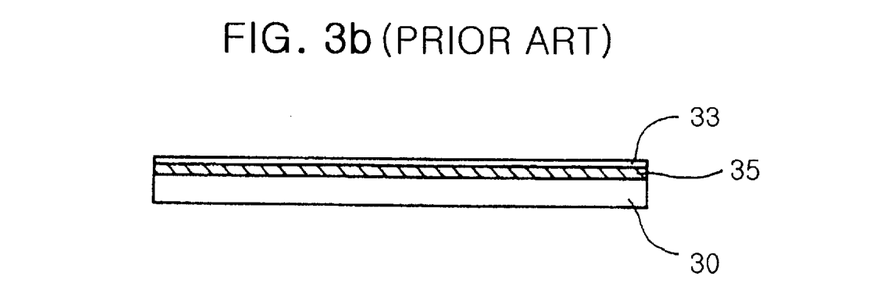
Figure 3C:
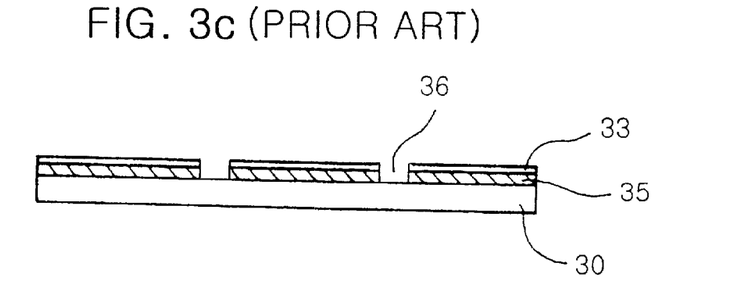
Figure 3D:
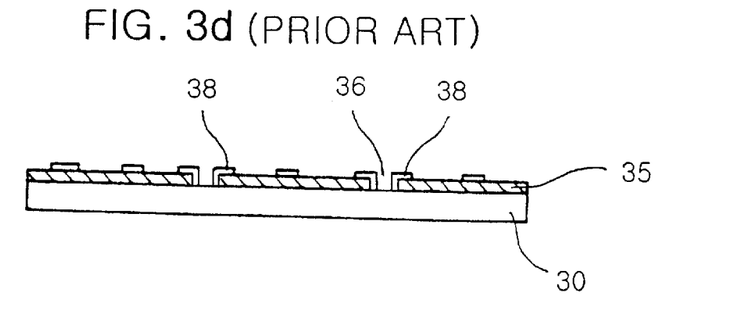

This build-up MLB manufacturing technique has the following features. That is, as shown in FIGS. 2a and 2b, a metal layer 22 is provided on one face, and as an intermediate layer, an insulating layer 20 or the insulating layer 20 plus a metal layer 23 and another insulating layer 25 are provided. On the other face, there is provided a metal layer(or a resist layer) 24. Then a via hole is formed by carrying out a wet etching or by means of laser beams.

That is, as shown in FIG. 2b, the metal layer or resist layer 24 is formed in the following manner. That is, the required area is removed as much as needed to expose the insulating layer 25, and then, the insulating layer 25 is removed by carrying out a wet etching. The above process steps are repeated as much as required to form a hole down to the metal layer 22. Then to the mental layer 22, laser beams are irradiated to remove(optically decompose) the etching residue and the insulating layer which is surface-coupled to the metal layer 22.

In the above method, the laser beams reach the bottom, and therefore, the inter-layer contacts are superior, thereby giving a high reliability.

However, in this method, in order to form the via hole, the conductive mental layer is partly exposed, and then, a wet etching and laser beams are used, with the result that the process is complicated.

As another example, there is the build-up MLB manufacturing technique of Japanese Patent Laid-open No. Hei-6-104568.

As shown in FIG. 3, an insulating film 35 is coated on a conductive supporting substrate 30 by pasting, and then, a material layer 33 highly sensitive to the laser beams is made to be stacked thereupon Then excimer laser beams are irradiated to form a hole 36 through the insulating film 35 and the material layer 33. Then on the material layer 33 which is highly sensitive to the laser beams, and around the hole 36, there is formed a printed pattern 38. Then an electroplating is carried out by utilizing the supporting substrate as a cathode.

In this method, the selection of the material for the insulating film is diversified, this being an advantage. However, the material layer which is highly sensitive to the laser beams is used for the laser drilling, and therefore, a superfluous process step is added.

SUMMARY OF THE INVENTION

The present invention is intended to overcome the above described disadvantages of the conventional techniques.

Therefore it is an object of the present invention to provide a method for manufacturing a build-up multi-layer printed circuit board in which a YAG(yttrium aluminum garnet) laser is used upon the formation of a via hole on a multi-layer printed circuit board, such that it can have the following advantages: the manufacturing process would become simple; the component packaging density and freedom for the design of the board would be improved; and a high speed of signal process would be ensured.

According to a first aspect of the present invention, there is provided a method for manufacturing a build-up multi-layer printed circuit board including the steps of: forming a first printed circuit pattern on a copper clad laminate (CCL) by applying a general photo-etching process, said CCL having a copper foil on the one face thereof; stacking a resin-coated (on one face) copper foil (RCC) on said CCL with said first printed circuit pattern formed thereon, and heating and pressing this structure; irradiating a YAG laser to the board with said RCC stacked so as to form a via hole at a predetermined position by removing said RCC; carrying out an electroless and electro copper plating on said board with via hole formed therein, to form a plated layer; and forming a second printed circuit pattern on said plated layer so as to electrically connect said first and second printed circuit patterns, wherein the thickness of the copper foil constituting said CCL is 3–35 μm, the thickness of said RCC is 40–100 μm, the process conditions of said YAG laser should satisfy the output power of preferably 300–2000 mW and the wavelength of preferably 200–1,500 nm, said via hole is formed in the diameter of 25–200 μm and the depth of 20–100 μm, and said electroplated layer is formed in thickness of 7–25 μm.

According to a second aspect of the present invention, there is provided a method for manufacturing a build-up multi-layer printed circuit board including the steps of: forming a first printed circuit pattern on a copper clad laminate (CCL) by applying a general photo-etching process, said CCL having a copper foil on the one face thereof; primarily stacking a resin-coated (on one face) copper foil (RCC) on said CCL with said first printed circuit pattern formed thereon, and heating and pressing this structure; forming a second printed circuit pattern on the board with said RCC primarily stacked thereon by applying the general photo-etching process; secondarily stacking RCC on the board with said second printed circuit pattern formed thereon, and heating and pressing this structure; irradiating a YAG laser to the board with said RCC stacked secondarily so as to form a via hole at a predetermined position by removing said RCC stacked primarily and secondarily; carrying out an electroless and electro copper plating on the board with said via hole formed therein, to form a plated layer; and forming a third printed circuit pattern on said plated layer so as to electrically connect the layers on which said first to third printed circuit patterns are formed, wherein the thickness of the copper foil constituting said CCL is 3–35 μm, the thickness of said RCC is at least 40–100 μm, the process conditions of said YAG laser should satisfy the output of preferably 300–5000 mW and the wavelength of preferably 200–1,500 nm, said via hole is formed in the diameter of 25–200 μm and the depth of 40–300 μm, and said electroplated layer is formed in thickness of 7–25 μm.

According to a third aspect of the present invention, there is provided a method for manufacturing a build-up multi-layer printed circuit board including the steps of: forming a first printed circuit pattern on a copper clad laminate (CCL) by applying a general photo-etching process respectively, said CCL having copper foils on both faces thereof; stacking a resin-coated (on one face) copper foil (RCC) on said CCL with said first printed circuit pattern formed thereon respectively, and heating and pressing this structure; irradiating a YAG laser to the board with said RCC stacked so as to form a via hole at a predetermined position by removing said RCC respectively; carrying out an electroless and electro copper plating on the board with said via holes formed therein, to form a plated layer; forming a second printed circuit pattern on said plated layer so as to electrically connect the layers on which said first and second printed circuit patterns are formed; and continuously stacking said RCC on the board formed according to said steps to form n printed circuit patterns, wherein the thickness of the copper foil constituting said CCL is 3–35 μm, the thickness of said RCC is 40–100 μm, the process conditions of said YAG laser should satisfy the output power of preferably 300–2000 mW and the wavelength of preferably 200–1,500 nm, said via hole is formed in the diameter of 25–200 m and the depth of 20–100 μm, and said electroplated layer is formed in thickness of 7–25 μm.

According to a fourth aspect of the present invention, there is provided a method for manufacturing a build-up multi-layer printed circuit board including the steps of: forming a first printed circuit pattern on a copper clad laminate (CCL) by applying a general photo-etching process respectively, said CCL having a copper foil on both faces thereof; primarily stacking a resin-coated (on one face) copper foil (RCC) on said CCL with said first printed circuit pattern formed thereon respectively, and heating and pressing this structure; forming a second printed circuit pattern on the board with said RCC primarily formed thereon by applying the general photo-etching process; secondarily stacking RCC on said second printed circuit pattern formed thereon respectively, and heating and pressing this structure; irradiating a YAG laser to the board so as to form a via hole at a predetermined position by removing said RCC stacked primarily and secondarily, carrying out an electroless and electro copper plating on the board with said via holes formed therein, to from a plated layer; forming a third printed circuit pattern on said plated layer so as to electrically connect the layers on which said first to third printed circuit patterns are formed; and continuously stacking said RCC on the board formed according to said steps to form n printed circuit patterns, wherein the thickness of the copper foil constituting said CCL is 3–35 μm, the thickness of said RCC is at least 40–100 μm, the process conditions of said YAG laser should satisfy the output of preferably 300–5000 mW and the wavelength of preferably 200–1,500 nm, said via hole is formed in the diameter of 25–200 μm and the depth of 40–300 μm, and said electroplated layer is formed in thickness of 7–25 μm.

According to a fifth aspect of the present invention, there is provided a method for manufacturing a build-up multi-layer printed circuit board including the steps of: forming a first printed circuit pattern on a copper clad laminate (CCL) by applying a general photo-etching process respectively, said CCL having a copper foil on both faces thereof; primarily stacking a resin-coated (on one face) copper foil (RCC) on said CCL with said first printed circuit pattern formed thereon respectively, and heating and pressing this structure; irradiating a YAG laser to the board with said RCC stacked so as to form a plated through hole(PTH) at a predetermined position by removing said RCC stacked and said CCL; carrying out an electroless and electro copper plating on the board with said PTH formed therein, to form a plated layer respectively; forming a second printed circuit pattern on said plated layer to electrically connect the upper and lower portions of said second printed circuit pattern; secondarily stacking RCC on said second printed circuit pattern formed thereon respectively, and heating and pressing this structure; forming a third printed circuit pattern on the board with said RCC stacked secondarily thereon; and continuously stacking said RCC on the board formed according to said steps to form n printed circuit patterns, wherein the thickness of the copper foil constituting said CCL is 3–35 μm, the thickness of said RCC is at least 40–100 μm, the process conditions of said YAG laser should satisfy the output of preferably 300–5000 mW and the wavelength of preferably 200–1,500 nm, said PTH is formed in the diameter of 25–200 μm and the depth of 400–800 μm, and said electroplated layer is formed in thickness of 7–25 μm.

BRIEF DESCRIPTION OF THE DRAWINGS

The above object and other advantages of the present invention will become more apparent by describing in detail the preferred embodiments of the present invention with reference to the accompanying drawings in which.

DETAILED DESCRIPTION OF THE PREFERRED EMBODIMENTS

A method for manufacturing a build-up multi-layer printed circuit board according to the preferred embodiments of the present invention utilizes a YAG laser upon the formation of a via hole. In more detail, if the via hole is formed by using the YAG laser, the diameter of hole can be reduced to 100 μm or less, such that a component packaging density can be increased to thereby manufacture a high integrated board. In addition, the YAG laser can form the via hole directly connecting a plurality of printed circuit layers, such that the freedom for the design of the board can be improved, Furthermore, the via hole takes a tapered shape, such that the reliability of electroplating within the via hole can be ensured.

FIGS. 4a to 4f are schematic views showing the manufacturing process for the build-up multi-layer printed circuit board according to an embodiment of the present invention, The manufacturing process of the present invention has to be carried out on the both faces of the substrate, but hereinafter, the descriptions will be made only for one face for the sake of the describing simplicity.

Figure 4A:
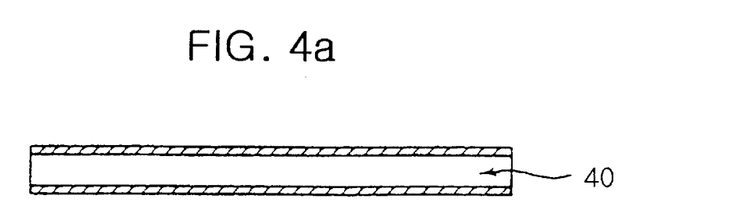
FIG. 4 is a schematic view showing the manufacturing process for the build-up multi-layer printed circuit board according to an embodiment of the present invention.
Figure 4B:
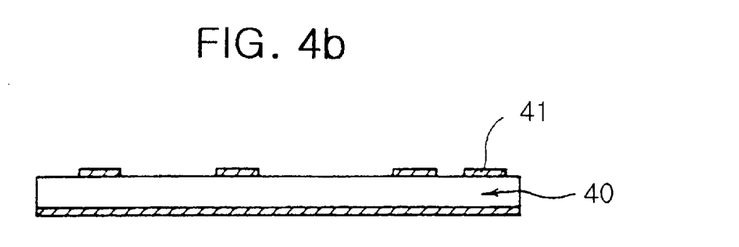

As shown in FIGS. 4a and 4b, a first printed circuit pattern 42 is formed by applying the general photo-etching process on a CCL 40 which is attached with copper foils on the both faces thereof, In this case, the CCL 40, which is attached with the copper foil on the one face thereof, may be of course used.

Figure 4C:
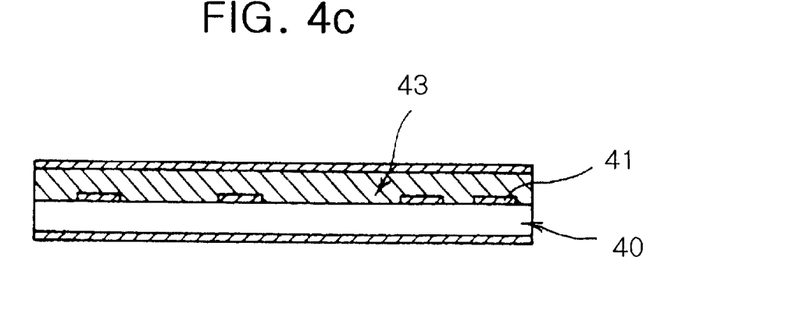

Then as shown in FIG. 4c, a resin-coated copper foil (RCC) 43 on the one face thereof is stacked on the board 40 on which the first printed circuit pattern(42) has been formed. Then the structure is heated and pressed, thereby carrying out a pre-stacking.

In the present invention, the CCL 40 is formed in such a manner that a copper foil which is electro-deposited or roll-annealed on a material made by the impregnation of glass in a fiber is heated and pressed by means of a predetermined press. The thickness of the copper foil should be preferably 3–35 $\mu$m. The CCL may be subject to a general oxidation process to improve the contact with the RCC.

Figure 5:
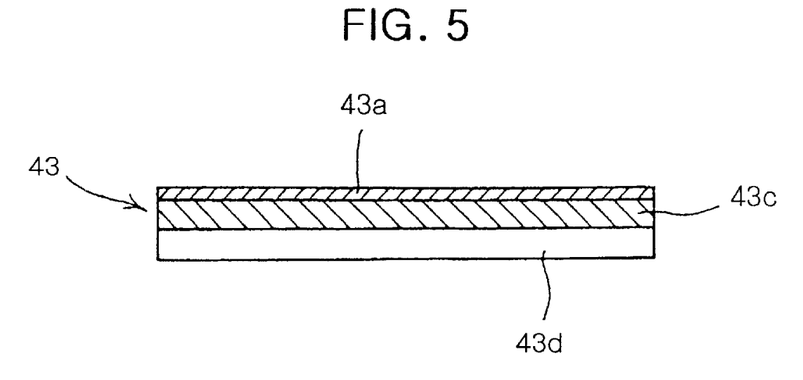
FIG. 5 is a sectional view showing one of the resin-coated copper foils according to the present invention.

The RCC 43 used in the present invention is selected from a group consisting of FR-4, polyimide, a pure resin cyanate ester, aramide, PTFE and the like. Preferably, the RCC 43 has an epoxy insulation resin which is coated on the one face of the copper foil. More preferably, the RCC 43 may be coated in the sequence of a semi-curing resin (for example, B-stage resin) 43b, a curing resin (for example, C-stage) 43c and a copper foil 43a, as shown in FIG. 5. Further, in the case where the number of the layers is large, the RCC is formed by repeating the heating and pressing process several times, and by considering this, the resin for the RCC should have a high transition temperature Tg. For example, the transition temperature Tg should be 130° C. or over. The thickness of the RCC should be preferably 40–100 $\mu$m.

Figure 4D:
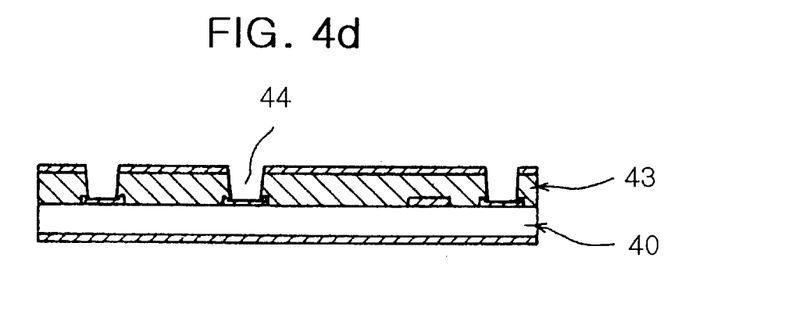

Then on the pre-stacked board 40 on which the RCC has been stacked, there is formed a via hole 44 by means of a YAG laser, as shown in FIG. 4d.

The operating conditions for the YAG laser are determined based upon various factors such as the laser pulse repetition rate (KHz), the distance between laser beams (bite size, $\mu$m), a velocity of a laser beam positioner (mm/sec), the number of passes, the effective spot size after the drilling, and the combination of the spiral ID (the inside diameter when the laser beams draw an initial circle), the number of the spiral revolution and the spiral pitch.

In the present invention, the output power of the laser should be preferably 300–2000 mW and the wavelength thereof should be preferably 1200–1,500 nm.

Further, the size of the via hole formed by means of the laser should be preferably 25–200 $\mu$m and the depth thereof should be preferably 20–100 $\mu$m, thereby ensuring the reliability of the electroplating within the via hole.

In the present invention, preferably, the via hole formed by means of the laser takes a tapered shape which is reduced in size in accordance with the depth of the drilling by means of the YAG laser, and more preferably, it has the inclination angle of the taper of 3–60°. against a vertical line.

On the other hand, upon the formation of the via hole, the YAG laser is irradiated on the RCC and on the part of the electroplated layer for forming a lower Printed circuit pattern, so that an excellent contact of the electroplated layer can be ensured. Therefore, the present invention can avoid a desmear process necessarily required during the formation of the via hole by means of a conventional chemical etching or an excimer laser.

Figure 4E:
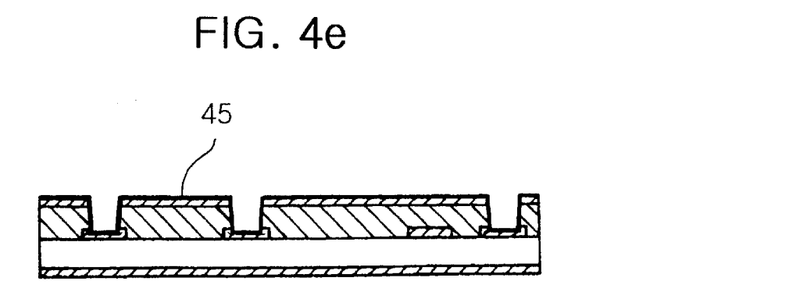
Figure 4F:
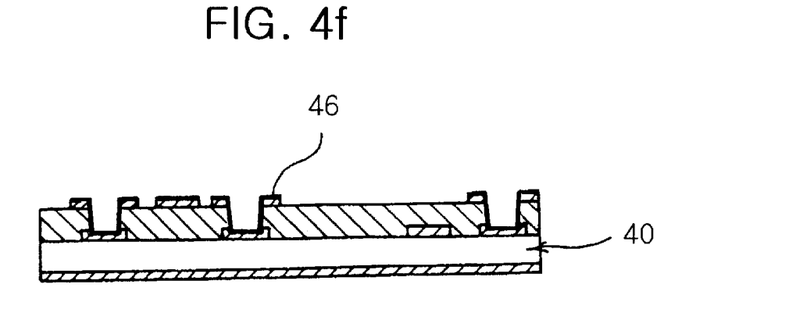

Then as shown in FIG. 4e, an electroless and electro copper plating are carried out on the board in which the via hole has been formed by means of the YAG laser, thereby forming an electroplated layer 45. At this time, the thickness of the electroplated layer should be preferably 7–25 $\mu$m. Then as shown in FIG. 4f, a second printed circuit pattern 46 is formed by applying the general photo-etching process so as to electrically connect the first printed circuit pattern and the second printed circuit pattern together.

On the other hand, the manufacturing process in FIGS. 4a to 4e has been described with the board of 4 layers where the RCC 43 is stacked on the top of the CCL 40, but is not limited thereto. In the present invention, in other words, the process for stacking the RCC and forming the via hole is repeated to thereby manufacture a build-up multi-layer printed circuit board on which n printed circuit patterns are formed.

Figure 4G:
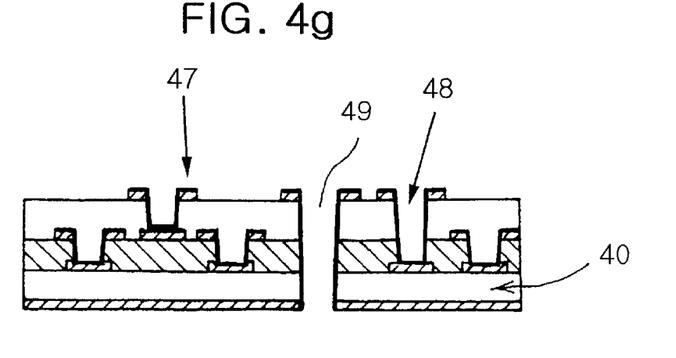

Unlike the manufacturing method of the printed circuit board as discussed above, the via hole 48 as shown in FIG. 4g shows an another process for manufacturing printed circuit board of the present invention. Specifically, in the present invention, not only the inter-layer patterns adjacent to each other but also the inter-layer patterns not adjacent to each other such as, for example, the first printed circuit pattern 41 and the third printed circuit pattern 47 can be efficiently connected electrically by using the YAG laser. That is, when compared with the conventional via hole forming method by means of the chemical etching or the excimer laser, the via hole forming method of the present invention by means of the YAG laser can effectively connect the inter-layer patterns not adjacent to each other, so that the freedom for the design of the printed circuit board can be improved.

Figure 6A:
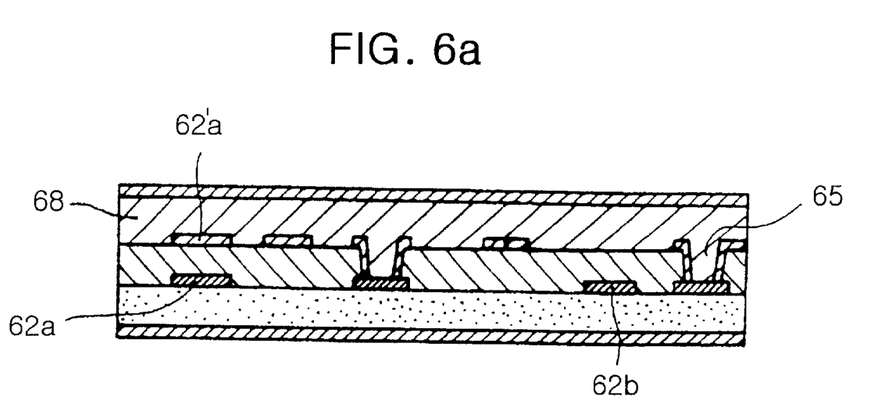
FIG. 6 is a schematic view showing the manufacturing process for the build-up multi-layer printed circuit board according to another embodiment of the present invention.
Figure 6B:
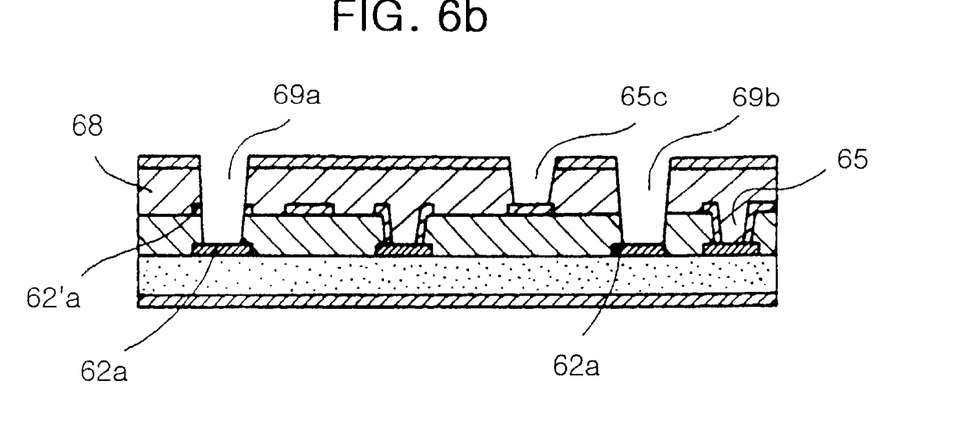

In more detail, as shown in FIG. 6a, a new RCC 68 is stacked on the board manufactured by the process of FIGS. 4a to 4f, and then the structure is heated and pressed Next, as shown in FIG. 6b, the YAG laser is irradiated to the board with RCC stacked thereon to form the via hole. Then as shown in FIG. 6c, a new printed circuit board is formed.

Figure 6C:
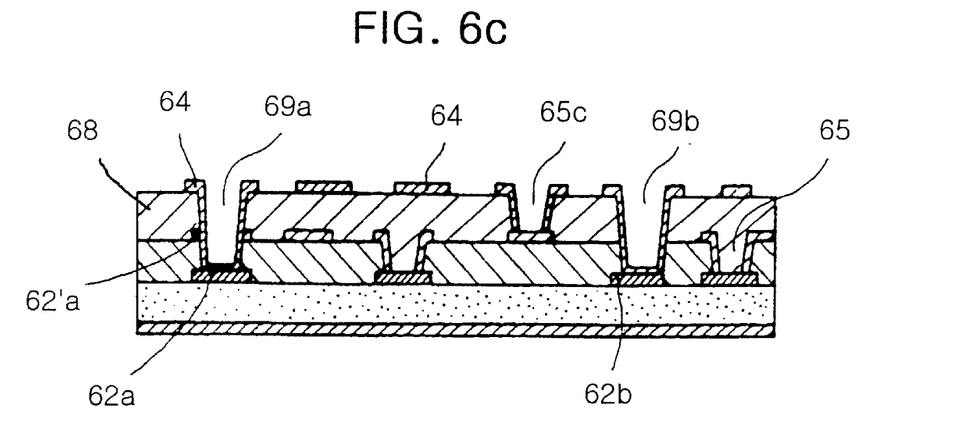

As shown in FIG. 6c, the stacked RCC are all removed by means of the YAG laser to thereby form a via hole 69a which directly connects the first to third printed circuit patterns 62a, 62'a and 64. Of course, the via hole 69b can be formed to directly connect the first and third printed circuit patterns 62b and 64.

Preferably, the via hole 65 can be formed to connect the first and second printed circuit patterns and the via hole 65c can be formed to connect the second and third printed circuit patterns, in the similar process to FIGS. 4a to 4f.

As shown in FIG. 6, in the case where the via hole 65 connecting the first and second printed circuit patterns and the via holes 69a and 69b each connecting the first and third printed circuit patterns and the first to third printed circuit patterns exist together in the single board, the via hole 65 is firstly formed and the via holes 69a and 69b are then formed, or reversely thereto.

On the other hand, in case of forming the via holes 69a and 69b each connecting the first and third printed circuit patterns and the first to third printed circuit patterns, the operating conditions of the YAG laser are different from those in case of forming the via hole 65 connecting the printed circuit patterns adjacent to each other (for example, the first and second printed circuit patterns or the second and third printed circuit patterns). In the present invention, therefore, in case of forming the via holes 69a and 69b each connecting the printed circuit patterns not adjacent to each other, the output power range of the YAG laser should be preferably 300 mV–5000 mW and the wavelength range thereof should be preferably 200–1,500 nm.

Further, the size of the via hole formed by means of the laser should be preferably 25–200 $\mu$m and the depth thereof should be preferably 40–300 μm, thereby ensuring the reliability of the electroplating within the via hole.

In the present invention, preferably, the via hole formed by means of the laser takes a tapered shape which is reduced in size in accordance with the depth of the drilling of the via hole by means of the YAG laser, and more preferably, it has the inclination angle of the taper of 1–40° against a vertical line.

Upon the formation of the via hole, the YAG laser is irradiated on the RCC and on the part of the electroplated layer for forming a lower printed circuit pattern, so that an excellent contact of the electroplated layer can be ensured.

With the formation of the via hole by means of the YAG laser, as discussed above, the present invention can provide the printed circuit board on which the printed circuit patterns adjacent to each other (for example, the first and second printed circuit patterns or the second and third printed circuit patterns) as well as the printed circuit patterns not adjacent to each other (for example, the first to third printed circuit patterns or the first and third printed circuit patterns) are directly connected to each other. Moreover, by repeating the process described in the above, the multi-layer printed circuit board having n printed circuit patterns may be manufactured.

Figure 7A:
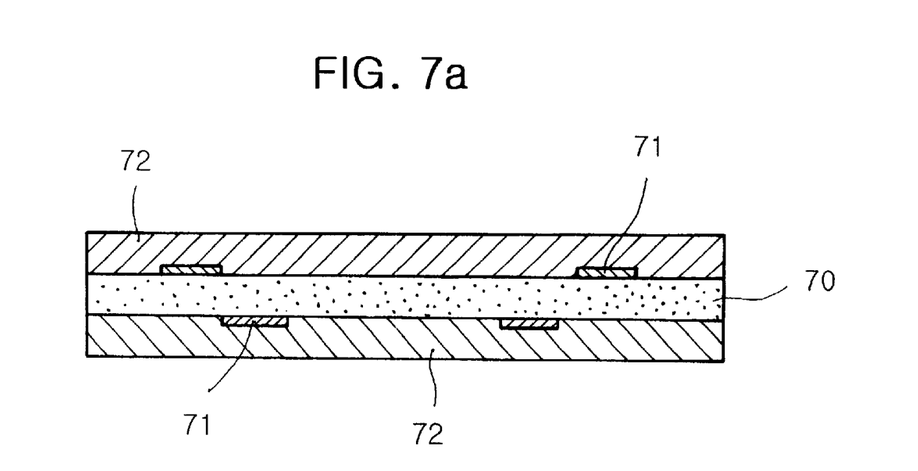
FIG. 7 is a schematic view showing the manufacturing process for the build-up multi-layer printed circuit board according to still another embodiment of the present invention.
Figure 7B:
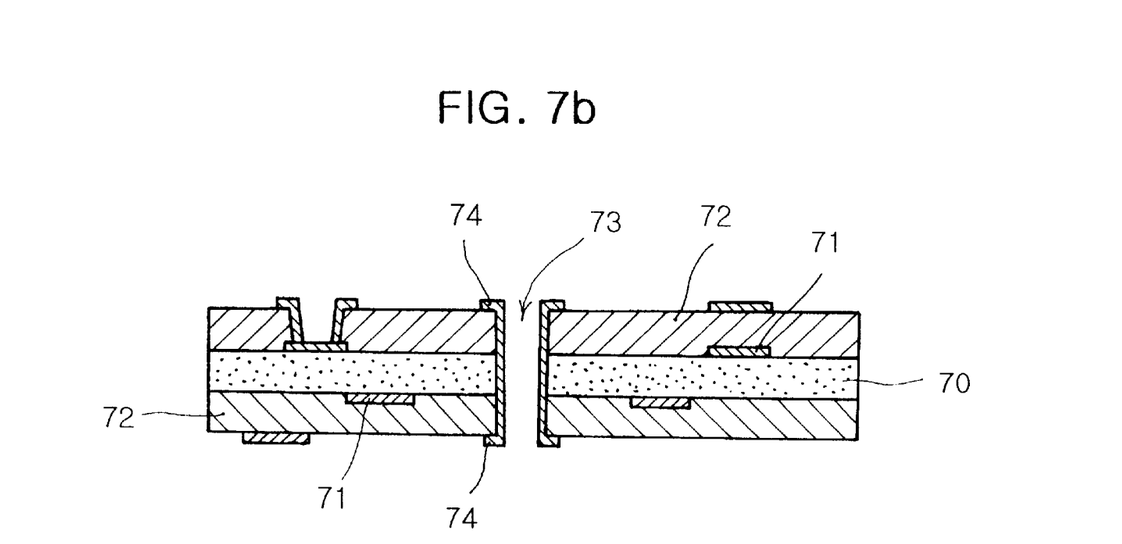
Figure 7C:
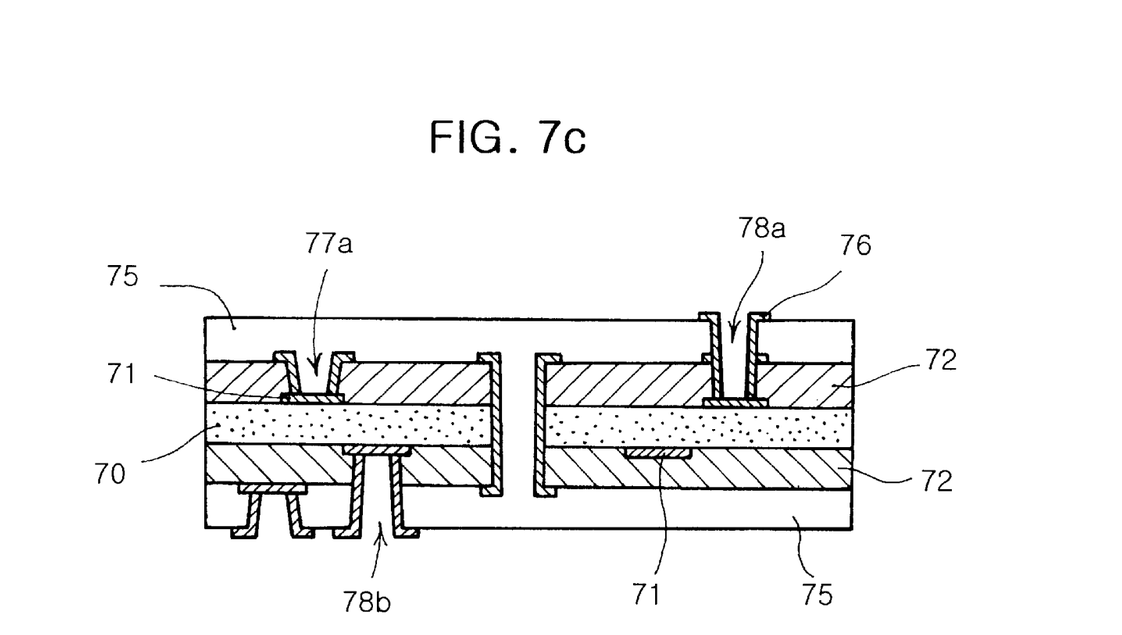

FIG. 7 shows the manufacturing process for the build-up multi-layer printed circuit board according to still another embodiment of the present invention.

As shown in FIG. 7a, a first printed circuit pattern 71 is formed on a CCL 70 having a copper foil attached on the both faces thereof by applying a general photo-etching process. Then, an RCC 72 having an insulation resin coated on the one face thereof is primarily stacked on the board with the first printed circuit pattern formed thereon, and the structure is heated and pressed to form a pre-stacked board.

As shown in FIG. 7b, the YAG laser is irradiated to the board on which the RCC 72 is attached to remove the CCL 70 and the RCC 72 stacked primarily, thereby forming a plated through hole (PTH) 73 at a predetermined position. Next, an electroless and electro copper plating are carried out on the board with the PTH formed thereon to form an electroplated layer and then, a second printed circuit pattern 74 is formed on the electroplated layer to electrically connect the upper and lower portions of the second printed circuit pattern 74.

In the present invention, in the manufacturing process of the printed circuit board on which the PTH is formed by means of the YAG laser, the operating conditions for the YAG laser used for the formation of the PTH are different from those in case of forming the via hole as discussed above. In other words, the output power range of the YAG laser should be preferably 300–5000 mW and the wavelength thereof should be preferably 200–1,500 nm. Also, the PTH is formed in the diameter of 25–200 μm and the depth of 400–800 μm.

Next, the RCC 75 is stacked secondarily on the board with the second printed circuit pattern 74 formed thereon, thereby forming a third printed circuit pattern on the board with the RCC stacked secondarily thereon. By repeating the process for stacking the RCC on the board, there is formed the multi-layer printed circuit board with n printed circuit patterns formed thereon.

Figure 8:
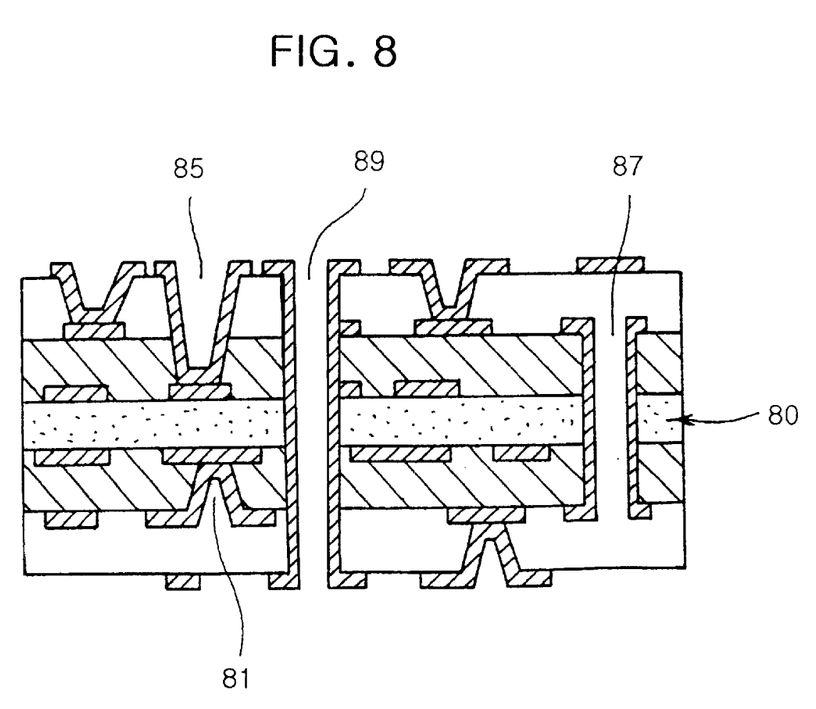
FIG. 8 is a sectional view showing an example of the build-up multi-layer punted circuit boards manufactured by the method for manufacturing the build-up multi-layer printed circuit board according to the present invention.

In this case, the via hole 77a connecting the first and second printed circuit patterns can be formed or the via hole 77b connecting the second and third printed circuit patterns can be formed. Further, the via holes 78a and 78b each connecting the first to third printed circuit patterns and the first and third printed circuit patterns can be formed. In other words, as shown in FIG. 8, when forming the PTH 87, the via holes 81 and 83 each connecting the first and second printed circuit patterns and the second and third printed circuit patterns can be formed, and the via hole 85 connecting the first to third printed circuit patterns can be formed. In addition, a run through hole (RTH) 89 can be formed.

On the other hand, in case of forming the PTH on the printed circuit board, the PTH should be filled by the insulation resin of 100% to prevent the reliability from being lowered due to the thermal impact repeatedly applied during the manufacturing process of the board. Therefore, the RCC (the RCC 78 as shown in FIG. 7) positioned on the top portion of the PTH 75 should preferably use a semi-curing resin unlike the conventional case.

The present invention will be further described based on an actual example.

EXAMPLE

As shown in FIG. 4, a printed pattern 41 was formed on a CCL 40 on which copper foils had been attached on the both faces thereof. Then a black oxide treatment was carried out on the printed pattern. Then, a resin-coated copper foil was stacked on the board 40. The resin-coated copper foil had a transition temperature of about 130° C., and its thickness was 40 μm. Then, heating and pressing was carried out at a pressure of 20–30 kg/cm$^2$ and at a temperature of 180° C. for 45 minutes or more. Thereafter, ND-YAG laser beams were irradiated to the relevant portion of the board to drill a tapered via hole having a diameter of about 60 μm.

Under this condition, the operating conditions for the YAG laser were as follows. That is, the laser pulse repetition rate was 0.785 KHz, the distance between the laser beams (bite doze) was 6.67 μm, the displacing velocity of the laser beams was 5,235 mm/sec, the number of passes was 1 pass, the effective spot size of the hole after the drilling was 25 μm, the spiral ID(the inside diameter when the laser beams formed an initial circle) was 25 μm, the number of the turns of the spiral was 2 turns, the pitch was 6.25 μm, and the output power of the laser was 320 mW.

Then an electroless copper plating was carried out on the board in which via hole had been formed by means of the YAG laser. Then, a Cu electroplating was carried out on it to form an electroplated layer 45 of a thickness of 15 μm. Then an imagible dry film was spread on the board on which the electroplated layer 45 had been formed. Then an exposure, a development, an etching and a dry film peeling operation were carried out to form a circuit pattern 46.

Then the above process was repeated to form the via hole, and them, an electroless copper plating was carried out to form a Cu layer having a thickness of 25 μm. Then an Sn/Pb electroplating was carried out to a thickness of 10 μm to form an etching resist. Then, a dray film peeling operation and an etching were carried out to remove the unnecessary copper foils, and then, the Sn/Pb layer was peeled, thereby forming a circuit connecting the outer layers to the inner layers. On the circuit board thus formed, an inter-layer contact reliability test was carried out, and the test showed an excellent result.

According to the present invention as described above, the resin insulating layers and the circuited conductive layers are alternately stacked so as to form a build-up type multi-layer printed circuit board. During this process, a YAG laser is used to drill a via hole, so that the reliability of the electroplating within the via hole would be improved. Further, the freedom for the design of the printed circuit board is high. Thus the via hole can be formed arbitrarily at the required position, and therefore, light weight and compactness of the product is rendered possible. Particularly, the range of the selection of the raw material for the printed circuit board is widened.

What is claimed is:

1. A method for manufacturing a build-up multi-layer printed circuit board, said method comprising the steps of:

forming a first printed circuit pattern on a copper clad laminate (CCL) by applying a general photo-etching process, said CCL having a copper foil on the one face thereof;

stacking a resin-coated (on one face) copper foil (RCC) on said CCL with said first printed circuit pattern farmed thereon, and heating and pressing this structure;

irradiating a YAG laser to the board with said RCC stacked so as to form a via hole at a predetermined position by removing said RCC;

carrying out an electroless and electro copper plating on said board with via hole formed therein, to form a plated layer; and forming a second printed circuit pattern on said plated layer so as to electrically connect said first and second printed circuit patterns, wherein the thickness of the copper foil constituting said CCL is 3–35 $\mu$m, the thickness of said RCC is 40–100 $\mu$m, the process conditions of said YAG laser should satisfy the output power of preferably 300–2000 mW and the wavelength of preferably 200–1,500 nm, said via hole is formed in the diameter of 25–200 $\mu$m and the depth of 20–100 $\mu$m, and said electroplated layer is formed in thickness of 7–25 $\mu$m.

2. The method as defined in claim 1, wherein said resin comprises a semi-curing resin and a curing resin.

3. The method as defined in claim 1, wherein said resin has a transition temperature of 130° C. or over.

4. A method for manufacturing a build-up multi-layer printed circuit board, said method comprising the steps of:

forming a first printed circuit pattern on a copper clad laminate (CCL) by applying a general photo-etching process, said CCL having a copper foil on the one face thereof;

primarily stacking a resin-coated (on one face) copper foil (RCC) on said CCL with said first printed circuit pattern formed thereon, and heating and pressing this structure;

forming a second printed circuit pattern on the board with said RCC primarily stacked thereon by applying the general photo-etching process;

secondarily stacking RCC on the board with said second printed circuit pattern formed thereon, and heating and pressing this structure;

irradiating a YAG laser to the board with said RCC stacked secondarily so as to form a via hole at a predetermined position by removing said RCC stacked primarily and secondarily;

carrying out an electroless and electro copper plating on the board with said via hole formed therein, to form a plated layer; and forming a third printed circuit pattern on said plated layer so as to electrically connect the layers on which said first to third printed circuit patterns are formed, wherein the thickness of the copper foil constituting said CCL is 3–35 $\mu$m, the thickness of said RCC is at least 40–100 $\mu$m, the process conditions of said YAG laser should satisfy the output of preferably 300–5000 mW and the wavelength of preferably 200–1,500 nm, said via hole is formed in the diameter of 25–200 $\mu$m and the depth of 40–300 $\mu$m, and said electroplated layer is formed in thickness of 7–25 $\mu$m.

5. The method as defined in claim 4, wherein said printed circuit board further comprises a via hole for electrically connecting the layers with said first and third printed circuit patterns formed thereon.

6. The method as defined in claims 4 or 5, wherein said printed circuit board further comprises a via hole for electrically connecting the layers with said first and second printed circuit patterns formed thereon or said second and third printed circuit patterns formed thereon.

7. The method as defined in claim 4, wherein said resin comprises a semi-curing resin and a curing resin.

8. The method as defined in claim 7, wherein said resin has a transition temperature of 130° C. or over.

9. A method for manufacturing a build-up multi-layer printed circuit board, said method comprising the steps of:

forming a first printed circuit pattern on a copper clad laminate (CCL) by applying a general photo-etching process respectively, said CCL having copper foils on both faces thereof;

stacking a resin-coated (on one face) copper foil (RCC) on said CCL with said first printed circuit pattern formed thereon respectively, and heating and pressing this structure;

irradiating a YAG laser to the board with said RCC stacked so as to form a via hole at a predetermined position by removing said RCC respectively;

carrying out an electroless and electro copper plain on the board with said via holes formed therein to form a plated layer;

forming a second printed circuit pattern on said plated layer so as to electrically connect the layers on which said first and second printed circuit patterns are formed; and continuously stacking said RCC on the board formed according to said steps to form n printed circuit patterns, wherein the thickness of the copper foil constituting said CCL is 3–35 $\mu$m, the thickness of said RCC is 40–100 $\mu$m, the process conditions of said YAG laser should satisfy the output power of preferably 300–2000 mW and the wavelength of preferably 200–1,500 nm, said via hole is formed in the diameter of 25–200 $\mu$m and the depth of 20–100 $\mu$m, and said electroplated layer is formed in thickness of 7–25 $\mu$m.

10. The method as defined in claim 9, wherein said resin comprises a semi-curing resin and a curing resin.

11. The method as defined in claim 9, wherein said resin has a transition temperature of 130° C. or over.

12. A method for manufacturing a build-up multi-layer printed circuit board, said method comprising the steps of:

forming a first printed circuit pattern on a copper clad laminate (CCL) by applying a general photo-etching process respectively, said CCL having a copper foil on both faces thereof;

primarily stacking a resin-coated (on one face) copper foil (RCC) on said CCL with said first printed circuit pattern formed thereon respectively, and heating and pressing this structure;

forming a second printed circuit pattern on the board with said RCC primarily formed thereon by applying the general photo-etching process;

secondarily stacking RCC on said second printed circuit pattern formed thereon respectively, and heating and pressing this structure;

irradiating a YAG laser to the board so as to form a via hole at a predetermined position by removing said RCC stacked primarily and secondarily;

carrying out an electroless and electro copper plating on the board with said via holes formed therein to form a plated layer;

forming a third printed circuit pattern on said plated layer so as to electrically connect the layers on which said first to printed circuit patterns are formed; and continuously stacking said RCC on the board formed according to said steps to form n printed circuit patterns, wherein the thickness of the copper foil constituting said CCL is 3–35 μm, the thickness of said RCC is at least 40–100 μm, the process conditions of said YAG laser should satisfy the output of preferably 300–5000 mW and the wavelength of preferably 200–1,500 nm, said via hole is formed in the diameter of 25–200 μm and the depth of 40–300 μm, and said electroplated layer is formed in thickness of 7–25 μm.

13. The method as defined in claim 12, wherein said printed circuit board further comprises a via hole for electrically connecting the layers with said first and third printed circuit patterns formed thereon.

14. The method as defined in claims 12 or 13, wherein said printed circuit board further comprises a via hole for electrically connecting the adjacent layers with printed circuit patterns formed thereon.

15. The method as defined in claim 12, wherein said resin comprises a semi-curing resin and a curing resin.

16. The method as defined in claims 12 or 15, wherein said resin has a transition temperature of 130° C. or over.

17. A method for manufacturing a build-up multi-layer printed circuit board, said method comprising the steps of:

forming a first printed circuit pattern on a copper clad laminate (CCL) by applying a general photo-etching process respectively, said CCL having a copper foil on both faces thereof;

primarily stacking a resin-coated (on one face) copper foil (RCC) on said CCL with said first printed circuit pattern formed thereon respectively, and heating and pressing this structure;

irradiating a YAG laser to the board with said RCC stacked so as to form a plated through hole(PTH) at a predetermined position by removing said RCC stacked and said CCL;

carrying out an electroless and electro copper plating on the board with said PTH formed therein to form a plated layer respectively;

forming a second printed circuit pattern on said plated layer to electrically connect the upper and lower portions of said second printed circuit pattern;

secondarily stacking RCC on said second printed circuit pattern formed thereon respectively, and heating and pressing this structure;

forming a third printed circuit pattern on the board with said RCC stacked secondarily thereon; and continuously stacking said RCC on the board formed according to said steps to form n printed circuit patterns, wherein the thickness of the copper foil constituting said CCL is 3–35 μm, the thickness of said RCC is at least 40–100 μm, the process conditions of said YAG laser should satisfy the output of preferably 300–5000 mW and the wavelength of preferably 200–1,500 nm, said PTH is formed in the diameter of 25–200 μm and the depth of 400–800 μm, and said electroplated layer is formed in thickness of 7–25 μm.

18. The method as defined in claim 17, wherein said printed circuit board further comprises a via hole for electrically connecting the adjacent layers with printed circuit patterns formed thereon.

19. The method as defined in claims 17 or 18, wherein said printed circuit board further comprises a via hole for electrically connecting three printed circuit layers with printed circuit patterns formed thereon.

20. The method as defined in claim 17, wherein said resin comprises a semi-curing resin and a curing resin.

21. The method as defined in claim 17, wherein said resin of said RCC stacked on the top portion of said PTH comprises only a semi-curing resin.

22. The method as defined in claim 20, wherein said resin has a transition temperature of 130° C. or over.

* * * * *